United States Patent [19]

Hamada et al.

[11] 4,244,056
[45] Jan. 6, 1981

[54] NOISE REDUCTION CIRCUIT

[75] Inventors: Masanori Hamada; Sueji Kawaguchi, both of Toda, Japan

[73] Assignee: Clarion Co., Ltd., Tokyo, Japan

[21] Appl. No.: 19,840

[22] Filed: Mar. 12, 1979

[30] Foreign Application Priority Data

Mar. 16, 1978 [JP] Japan .................................. 53/29256

[51] Int. Cl.³ ........................ H04B 1/10; H04B 15/00
[52] U.S. Cl. .................................. 455/213; 455/218;
455/297; 455/306; 455/307; 455/312
[58] Field of Search ............... 325/313, 344, 348, 473,
325/474, 478, 480, 399, 424, 426, 427; 455/296,
297, 303, 305, 306, 307, 312, 212, 213, 220, 218,
222–224, 266–268

[56] References Cited
U.S. PATENT DOCUMENTS

| 3,912,951 | 10/1975 | Kihara | 250/199 |
| 4,063,039 | 12/1977 | Endres et al. | 325/399 |
| 4,087,641 | 5/1978 | Sugai | 325/348 |

*Primary Examiner*—Marc E. Bookbinder
*Attorney, Agent, or Firm*—Blanchard, Flynn, Thiel, Boutell & Tanis

[57] ABSTRACT

In an FM stereo-receiver, a noise reduction circuit includes a by-pass circuit connected between the output of an FM detector and an earth potential point, the time constant of which is controlled to continuously vary the frequency characteristic at a path from the FM detector to an MPX circuit, thereby greatly reducing a high frequency noise inherent therein.

7 Claims, 2 Drawing Figures

NOISE REDUCTION CIRCUIT

SUMMARY OF THE INVENTION

This invention contemplates elimination of defects of such prior arts and is characterized by employment of a circuit for controlling the time constant of a by-pass circuit connected between an FM detector circuit and an earth potential point in accordance with the level of an IF signal to continuously vary the frequency characteristic at a path from said detector circuit to a MPX circuit.

DETAILED DESCRIPTION OF THE PREFERRED EMBODIMENTS

Figure 1:
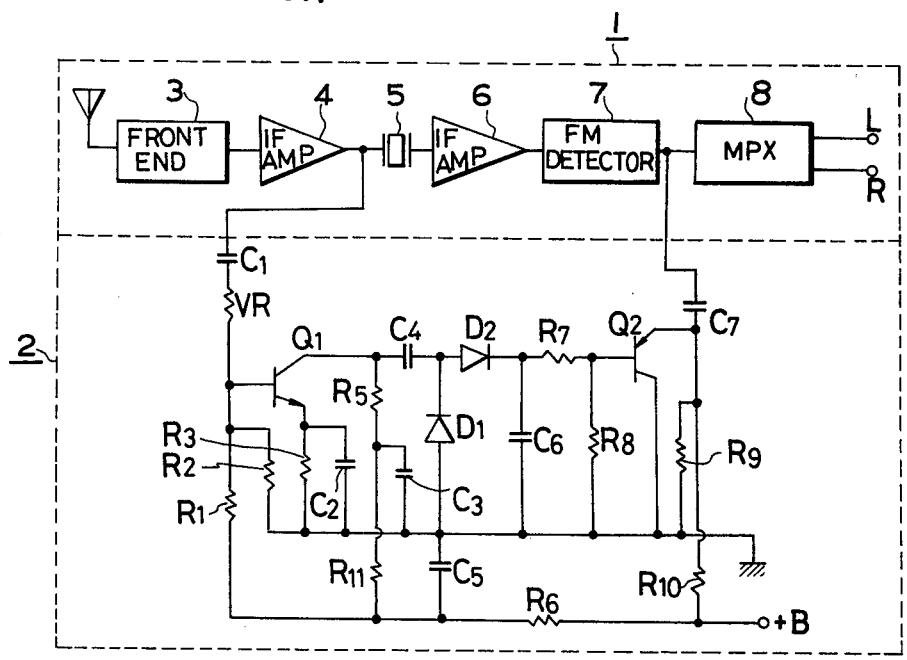
FIG. 1 is a diagram of one form of noise reduction circuit in accordance with this invention.

In FIG. 1, a reference numeral 1 designates a principal portion of an FM car-radio, and a reference numeral 2 designates a noise reduction circuit portion according to this invention. The radio portion 1 comprises an FM front end 3, IF amplifiers 4 and 6, a filter 5, an FM detector 7 and an MPX circuit having two output terminals L and R.

The noise reduction circuit portion 2 includes a variable resistor VR for adjusting the sensitivity thereof, a transistor $Q_1$ for amplifying an IF signal of 10.7 MHZ, capacitors $C_1$ to $C_7$, diodes $D_1$ and $D_2$ forming a voltage doubler rectifier circuit in cooperation with the capacitors $C_4$ and $C_6$, resistors $R_1$ to $R_{10}$ and a transistor $Q_2$ which is adapted to continuously vary its resistance as described hereinafter (is operable in the active region thereof). The transistor $Q_2$ and the capacitor $C_7$ are connected in series from a point between the FM detector 7 and the MPX circuit 8 to an earth potential point.

When there is no incoming signal, the transistor $Q_2$ is biased through the resistor $R_{10}$ by a +B power source (not shown) and accordingly is in an on-state, so that the capacitor $C_7$ is grounded.

On the other hand, when an FM stereo-signal is received, an IF signal of 10.7 MHZ from the IF amplifier 4 is applied to the transistor $Q_1$ through the capacitor $C_1$ and the variable resistor VR and amplified by the transistor $Q_1$. The amplified signal from the transistor $Q_1$ is rectified by the diodes $D_1$ and $D_2$ to charge the capacitors $C_4$ and $C_6$. A voltage across the capacitor $C_6$ is divided by the resistors $R_7$ and $R_8$ and is applied to the base electrode of the transistor $Q_2$ as a bias voltage thereof, to thereby vary the active region of the transistor $Q_2$. Accordingly, the capacitor $C_7$ is grounded through the active resistance of the transistor $Q_2$.

As is apparent from the above description, the active resistance of the transistor $Q_2$, and accordingly, a time constant consisting of this active resistance and the by-pass capacitor $C_7$ are controlled in accordance with the level of the IF signal, so that frequency characteristic at the path from the FM detector 7 to the MPX circuit 8 may be varied. Therefore, a high frequency noise signal contained in the stereo-signal is by-passed through the capacitor $C_7$ and the transistor $Q_2$, even if it is received under a weak electric field. Thus, the noise signal is greatly reduced.

When a stereo-signal having greater intensity of electric field than a predetermined value is received, the base potential of the transistor $Q_2$ will be higher than the emitter potential thereof due to +B voltage applied through the resistors $R_9$ and $R_{10}$. Accordingly, said transistor $Q_2$ turns off to cut the capacitor $C_7$ off from the earth potential point.

Figure 2:
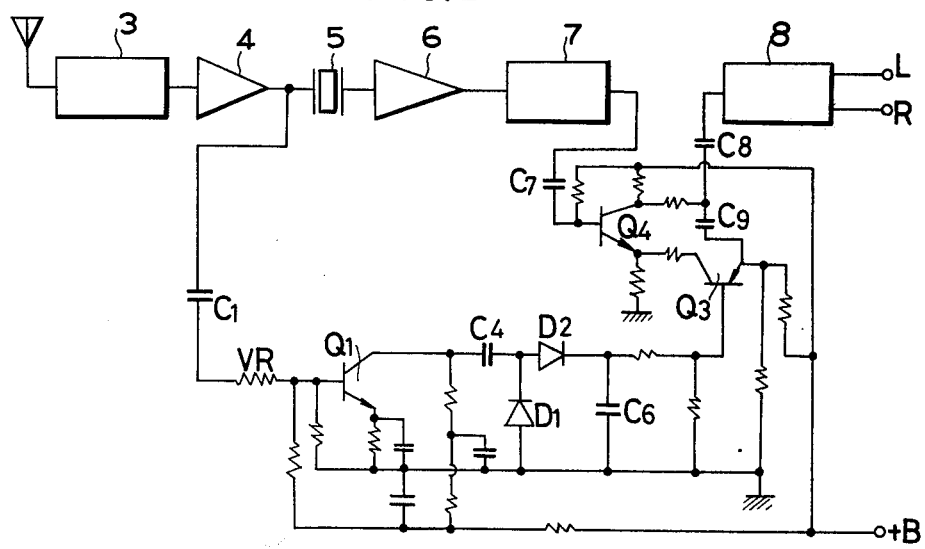
FIGS. 2 and 3 are diagrams of other forms of noise reduction circuit in accordance with this invention, respectively.
Figure 3:
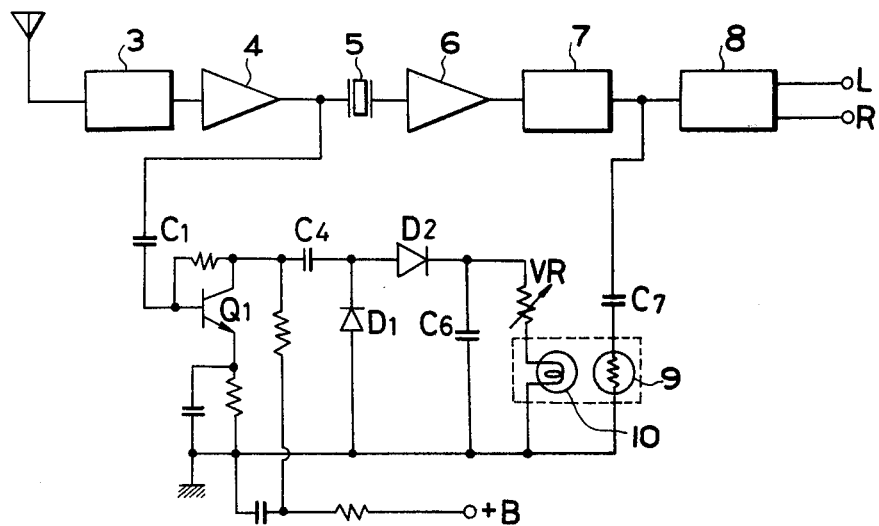

FIGS. 2 and 3 shows other embodiments of this invention, respectively. The circuit shown in FIG. 2 differs from that shown in FIG. 1 in that a transistor $Q_3$, a low frequency amplifying transistor $Q_4$ and a by-pass capacitor $C_9$ are employed and that two phase-inverted low frequency outputs of the transistor $Q_4$ is short-circuited by the transistor $Q_3$.

When the level of the IF signal is low, the impedance of the transistor $Q_3$ decreases and the high frequency component of an output of the FM detector 7 is by-passed through the capacitor $C_9$ and the transistor $Q_3$. On the other hand, when the level of the IF signal is relatively high, since the impedance of the transistor $Q_3$ increases, an output signal from a collector electrode of the transistor $Q_4$ is by-passed through the capacitor $C_8$.

The embodiment shown in FIG. 3 is adapted to vary a time constant of a by-pass circuit by using a photo-emitting element 10, such as a lamp, a photo emitting diode, etc. and a photo conductive element 9 such as a photo cell. The photo intensity of the photo emitting element 10 varies in accordance with the output of a doubler rectifier circuit consisting of capacitors $C_4$, $C_6$ and diodes $D_1$, $D_2$, so that the time constant consisting of a by-pass capacitor $C_7$ and the photo conductive element 9, the resistance of which is responsive to the photo intensity, may be controlled to by-pass a noise signal through the capacitor $C_7$ and the photo conductive element 9.

Figure 4:
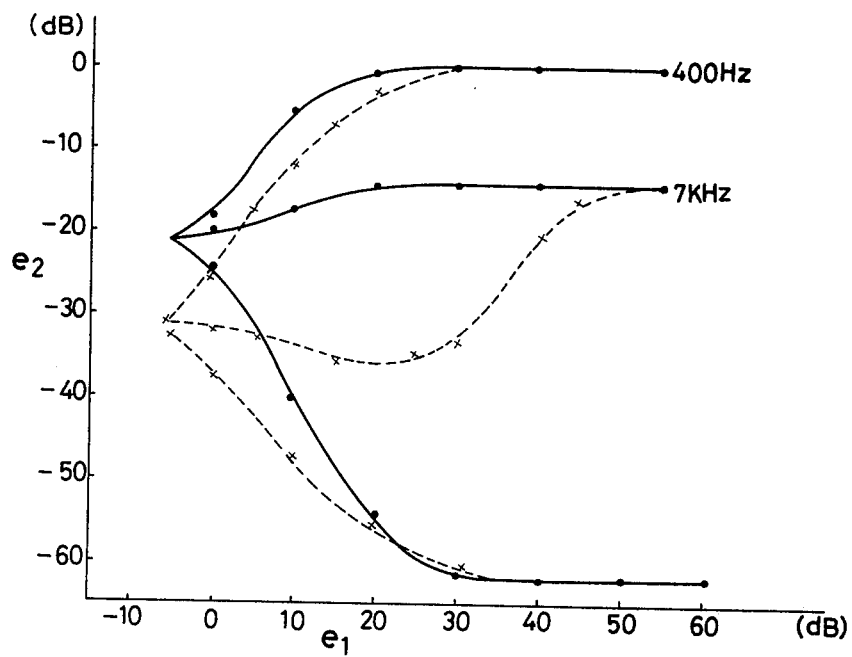
FIG. 4 is a characteristic curve showing a noise reduction effect according to this invention.

FIG. 4 is a characteristic curve for showing the noise reduction effect according to this invention. In the same figure, the abscissa represents an output voltage $e_1$ from a standard signal generator (not shown) applied to the circuit of this invention as an input therefor and the ordinate represents an output $e_2$ thereof. A solid line curve indicates the characteristic of a conventional circuit and a broken line curve indicates the charateristic of the invention circuit. It is apparent from the diagram that the broken line curve is constantly lower than the solid line curve and that, in particular, the noise reduction effect is remarkable at 7 KHZ.

In addition, in the circuit of this invention, the high frequency noise may be greatly reduced due to variation of the frequency characteristic and a stereo-pilot signal of 19 KHZ may be by-passed under a weak electric field. Therefore, the level of the pilot signal is lowered with reduction of the high frequency band, and switching between stereo receiving and monaural receiving may be automatically accomplished.

As is apparent from the foregoing, according to this invention, the time constant of a by-pass circuit connected to the output of an FM detector is controlled in response to variation of a received electric field to vary the frequency characteristic at a path from the FM detector to a MPX circuit. Therefore, a high frequency noise, for example, skip noise, multi-path noise, ignition noise, etc. inherent in an FM car radio is greatly reduced under a weak electric field and automatic switching between stereo receiving and monaural receiving is also attained.

Further, since the frequency characteristic is varied upon continuous control, abrupt variation of sound due to switching as in the prior art can be eliminated.

We claim:

1. A noise reduction circuit for an FM radio receiver, wherein said receiver includes at least IF signal generating means for producing an IF signal from a received incoming signal and FM detector means coupled to receive said IF signal, comprising a capacitor and a variable resistor means, said capacitor and said variable resistor means being connected in series between an output of said FM detector means and an earth potential point, and control means for continuously controlling the resistance of said variable resistor means in accordance with the level of said IF signal and thereby for continuously varying attenuation of a high frequency component of the incoming signal in response to the strength of the incoming signal to reduce noise contained therein.

2. A noise reduction circuit according to claim 1 wherein said variable resistor means includes an impedance varying transistor adapted to continuously vary its impedance in the active region thereof in response to said IF signal.

3. A noise reduction circuit according to claim 2 wherein said control means includes amplifier means for amplifying said IF signal, rectifier means for rectifying an output of said amplifier means and means for applying a rectified output of said rectifier means to the transistor.

4. A noise reduction circuit according to claim 3 which further includes a low frequency amplifying transistor for amplifying the output of said FM detector means to provide two low frequency amplified outputs in opposite phase to each other, said impedance varying transistor being coupled with said amplifying transistor to short-circuit said two amplified outputs.

5. A noise reduction circuit according to claim 1 wherein said variable resistor means includes photo-sensitive means the resistance of which continuously varies in response to the IF signal.

6. A noise reduction circuit according to claim 5 wherein said photo-sensitive means includes a light source for emitting light having intensity responsive to the IF signal and a photo-conductive element coupled to said light source to receive said light.

7. A noise reduction circuit for an FM radio receiver, wherein said receiver includes at least IF signal generating means for producing an IF signal from a received incoming signal and FM detector means coupled to receive said IF signal, comprising by-pass means connected between an output of said FM detector means and an earth potential point and control means for controlling a time constant of said by-pass means in accordance with the level of said IF signal whereby a noise signal contained in the incoming signal can be by-passed through said by-pass means, said by-pass means including a variable impedance transistor adapted to vary its impedance in response to said IF signal, said by-pass means further including a low frequency amplifying transistor for amplifying the output of said FM detector means to provide two low frequency amplified outputs in opposite phase to each other and said variable impedance transistor is coupled with said amplifying transistor to short-circuit said two amplified outputs.

* * * * *